(12) United States Patent
Thornton (10) Patent No.: US 6,922,423 B2
(45) Date of Patent: Jul. 26, 2005

(54) CONTROL SYSTEM FOR A SEMICONDUCTOR LASER

(76) Inventor: Robert L. Thornton, 19 E. Portola Ave., Los Altos, CA (US) 94022

( * ) Notice: Subject to any disclaimer, the term of this patent is extended or adjusted under 35 U.S.C. 154(b) by 185 days.

(21) Appl. No.: 10/411,636

(22) Filed: Apr. 11, 2003

(65) Prior Publication Data

US 2004/0202210 A1 Oct. 14, 2004

(51) Int. Cl.[7] .............................. H01S 3/00; H01S 3/13
(52) U.S. Cl. ............................... 372/38.07; 372/29.02; 372/29.021; 372/31; 372/32; 372/34; 372/38.01; 372/38.02
(58) Field of Search .............................. 372/34, 38.01, 372/38.02, 38.07, 29.02, 29.021, 31, 32, 29.01, 29.014, 29.015

(56) References Cited

U.S. PATENT DOCUMENTS

| | | | |
|---|---|---|---|
| 4,761,659 A | 8/1988 | Negishi ...................... 346/108 |
| 4,821,273 A | 4/1989 | Hori ............................ 372/31 |
| 5,141,330 A | * | 8/1992 | Gregory et al. ............... 374/32 |
| 5,197,076 A | 3/1993 | Davis et al. ................... 372/34 |
| 5,274,622 A | 12/1993 | Kono .......................... 369/116 |
| 5,309,458 A | 5/1994 | Carl ............................. 372/34 |
| 5,392,303 A | * | 2/1995 | Shiozawa et al. ............. 372/32 |
| 5,422,926 A | * | 6/1995 | Smith et al. ................. 378/121 |
| 5,563,898 A | 10/1996 | Ikeuchi et al. ................ 372/38 |
| 5,604,758 A | 2/1997 | AuYeung et al. ............. 372/34 |
| 5,680,410 A | 10/1997 | Kim et al. ..................... 372/34 |
| 5,754,574 A | * | 5/1998 | Lofthouse-Zeis et al. ..... 372/34 |
| 5,796,771 A | 8/1998 | DenBaars et al. ............. 372/75 |
| 5,867,513 A | 2/1999 | Sato ............................. 372/32 |
| 5,933,444 A | 8/1999 | Molva et al. .................. 372/75 |
| 5,982,802 A | 11/1999 | Thony et al. ................. 372/75 |
| 6,055,252 A | 4/2000 | Zhang .......................... 372/34 |
| 6,069,904 A | 5/2000 | Kitaoka et al. ................ 372/32 |
| 6,101,200 A | 8/2000 | Burbridge et al. ............ 372/29 |
| 6,229,832 B1 | * | 5/2001 | Baba et al. ............... 372/38.01 |
| 6,263,002 B1 | 7/2001 | Hsu et al. ....................... 372/6 |
| 6,301,279 B1 | 10/2001 | Garbuzov et al. ............. 372/36 |
| 6,324,198 B1 | 11/2001 | Otsuka ...................... 372/38.09 |
| 6,393,041 B1 | 5/2002 | Sato ...................... 372/29.021 |
| 6,408,013 B1 | 6/2002 | Akagi et al. ........... 372/29.021 |
| 6,795,478 B2 | * | 9/2004 | Hwang et al. ................ 372/96 |
| 2001/0014106 A1 | * | 8/2001 | Gevorgian et al. ............ 372/20 |
| 2002/0087768 A1 | 7/2002 | Srikanth et al. ............. 710/118 |
| 2002/0159487 A1 | 10/2002 | Thornton et al. ............. 372/26 |
| 2003/0169790 A1 | * | 9/2003 | Chieng et al. ................ 372/34 |
| 2003/0181796 A1 | * | 9/2003 | Pologe ....................... 600/322 |
| 2004/0061075 A1 | * | 4/2004 | Pruszenski, Jr. .......... 250/492.1 |
| 2004/0228377 A1 | * | 11/2004 | Deng et al. ................... 372/34 |

OTHER PUBLICATIONS

U.S. Appl. No. 10/411,636 "CONTROL System for a Semiconductor Laser".

(Continued)

*Primary Examiner*—Don Wong
*Assistant Examiner*—Leith A. Al-Nazer
(74) *Attorney, Agent, or Firm*—W. Douglas Carothers, Jr.

(57) ABSTRACT

A control system architecture that allows a semiconductor laser to be stabilized with respect to critical parameters, such as output power and/or emission wavelength, with a reduced cost with respect to the components required to implement control, while simultaneously maintaining or increasing precision of the control function. This is achieved using sophisticated integrated circuitry contained within the laser package to measure data related to multiple laser operation parameters and to transmit these parameters to a control circuit. In particular, precision thermal measurements may be used to eliminate the need for optical detectors in the laser package. The invention described herein has significant utility for different types of semiconductor lasers, including both edge emitting and VCSEL-type semiconductor lasers.

65 Claims, 9 Drawing Sheets

OTHER PUBLICATIONS

Fiedler et al., *"Design of VCSEL's for Feedback Insensitive Data Transmission and External Cavity Active Mode–Locking"*, IEEE Journal of Selected Topics in Quantum Electronics, vol. 1, No. 2, Jun. 1995, pp. 442–450.

McAleavey et al., *"Narrow Linewidth, Tunable Tm3+– Doped Fluroide Fiber Laser for Optical–Based Hydrocarbon Gas Sensing"*, IEEE Journal of Selected Topincs in Quantum Electronics, vol. 3, No. 4, Aug. 1997, pp. 1103–1111.

Booth et al., *"Operation of Diode Laser Pumped Tm3+ ZBLAN Upconversion Fiber Laser at 482 nm"*, IEEE Journal of Quantum Electronics, vol. 32, No. 1, Jan. 1996, pp. 118–123.

* cited by examiner

CONTROL SYSTEM FOR A SEMICONDUCTOR LASER

FIELD OF THE INVENTION

The present invention is directed generally to lasers, and more particularly to an approach to packaging and controlling a semiconductor laser.

BACKGROUND

Semiconductor lasers are key elements in the advancing performance of many systems, such as optical fiber communications, optical data storage, laser printing, optical clock generation and quantum key distribution. It is almost always the case that to achieve a high level of system performance, the emission characteristics of the laser must be maintained within a well-defined, and typically relatively narrow, window. In the most common and simplest cases, this window is defined to be an output power level window, and an optical photodetector is used to monitor and control the output power level from the device.

For edge emitting, semiconductor lasers, the power is typically monitored from the emission from the rear facet of the laser, while the useful power is extracted from the front facet. The placement of a photodetector at the rear of the laser places significant constraints on the geometry and dimensions of the laser package that the laser is mounted within.

For a typical vertical cavity, surface emitting laser (VCSEL) architecture, there is often only one useful optical output, and so there is a need for some mechanism for diverting part of the output beam to a photodetector so that the output may be monitored. In many cases, an optical beamsplitter is used to divert part of the output beam to the photodetector. Some edge emitting lasers also use a beamsplitter for diverting a small fraction of the main output beam to the monitoring photodiode.

The photodetector generates a laser power output signal that is relayed back to a control circuit that is external to the laser package. The control circuit then determines the appropriate DC current drive that should be supplied to the laser in order to maintain the output power at a constant target level. An important feature of this architecture is that one, and in some cases two, electrical leads are required for the sole function of transmitting the "laser power level output" signal from the laser package to the control circuit. These electrical leads are provided as pins protruding from the laser package. In general, for each additional internal measurement parameter that is transmitted to the control circuit, one or two additional electrical pins are required.

This multiplicity of electrical pins is wasteful of space. Furthermore, it serves to inhibit the number of signals generated for relaying to the control circuit. One of the primary drivers for the cost of a laser module is the size of the package, which is in turn driven, in part, by the number of independent electrical connections required to exit the laser package. Therefore, compromises are often made between keeping the cost of the laser package low and the number of control signals extracted from the package.

SUMMARY OF THE INVENTION

In view of the above, it would be desirable to have some method of increasing the number of independent data items transmitted between the laser and its control circuit, without increasing the number of electrical pins exiting the laser package. Furthermore, it would be desirable to simplify the method of controlling of a laser to operate in a stable manner with a reduced number of components, or with simpler, less expensive components.

Generally, the present invention relates to a control system architecture that allows a semiconductor laser to be stabilized with respect to critical parameters, such as output power and/or emission wavelength, with a reduced cost with respect to the components required to implement control, while simultaneously maintaining or increasing precision of the control function. This is achieved by using low cost but sophisticated integrated circuitry that is contained within the laser package to measure data related to multiple laser operational parameters and to transmit these parameters to a control circuit. In particular, precision thermal measurements may be used to eliminate the need for optical detectors in the laser package. The invention described herein has significant utility for different types of semiconductor lasers, including both edge emitting and VCSEL-type semiconductor lasers.

One particular embodiment of the invention is directed to a laser device that has a laser package housing and a semiconductor laser unit disposed within the package housing. At least one sensor is disposed within the package housing. A telemetry unit disposed within the package housing is coupled to the at least one sensor. The telemetry unit is coupled to a data link that passes out of the laser package.

Another embodiment of the invention is directed to a method for controlling a laser that comprises sensing at least two operational characteristics within a laser package to produce at least two sensor signals. The at least two sensor signals are combined inside the laser package to produce a telemetered output signal. The telemetered signal is directed out of the laser package.

Another embodiment of the invention is directed to a method for controlling a vertical cavity, surface emitting laser (VCSEL). The method comprises determining a value of operating voltage across the VCSEL and bias current through the VCSEL, and determining a single mode operating point of the VCSEL from a derivative of the operating voltage with respect to drive current. The current is set to a value associated with the single mode operating point.

Another embodiment of the invention is directed to a method for controlling an external cavity, vertical cavity, surface emitting laser (EC VCSEL). The EC VCSEL has a cavity formed by a first reflector, an intracavity reflector and an output coupler. The method includes determining a temperature of the cavity of the EC VCSEL and controlling independently the temperature of the cavity of the EC VCSEL to a target value and the bias current of the EC VCSEL so as to maintain laser oscillation on a stable single mode.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In general, the present invention is directed to an approach to applying conventional control functionality to a semiconductor laser in a simplified package, and to applying complex control functionality to a semiconductor laser with reduced package complexity. The inclusion of telemetry processing electronics within the laser package itself reduces the need for the multiplicity of output pins when measuring several operating parameters. Consequently, the laser package can be made smaller and less expensive than current approaches, or may remain at the same size, while providing for more sophisticated control algorithms based on a larger set of sense variables. While the invention is applicable to all types of semiconductor lasers, the following description is directed mostly to VCSEL devices, for the purposes of illustration.

A conventional laser package typically includes a monitoring photodiode for feeding output power information back to the control circuit, and may also require an optical beamsplitter to divert some of the output power to the monitoring photodiode. The power monitor signal is typically used by the control circuit to maintain the output power of the laser at a stable level.

The function of the photodetector may be replaced in many monitoring situations by the function of precision measurements of the temperature of the laser chip at multiple points (Tn) along with measurements of the voltage (V) and knowledge (not necessarily measurement) of the current (I) applied to the laser chip, followed by appropriate numerical analysis of this information.

Figure 1:
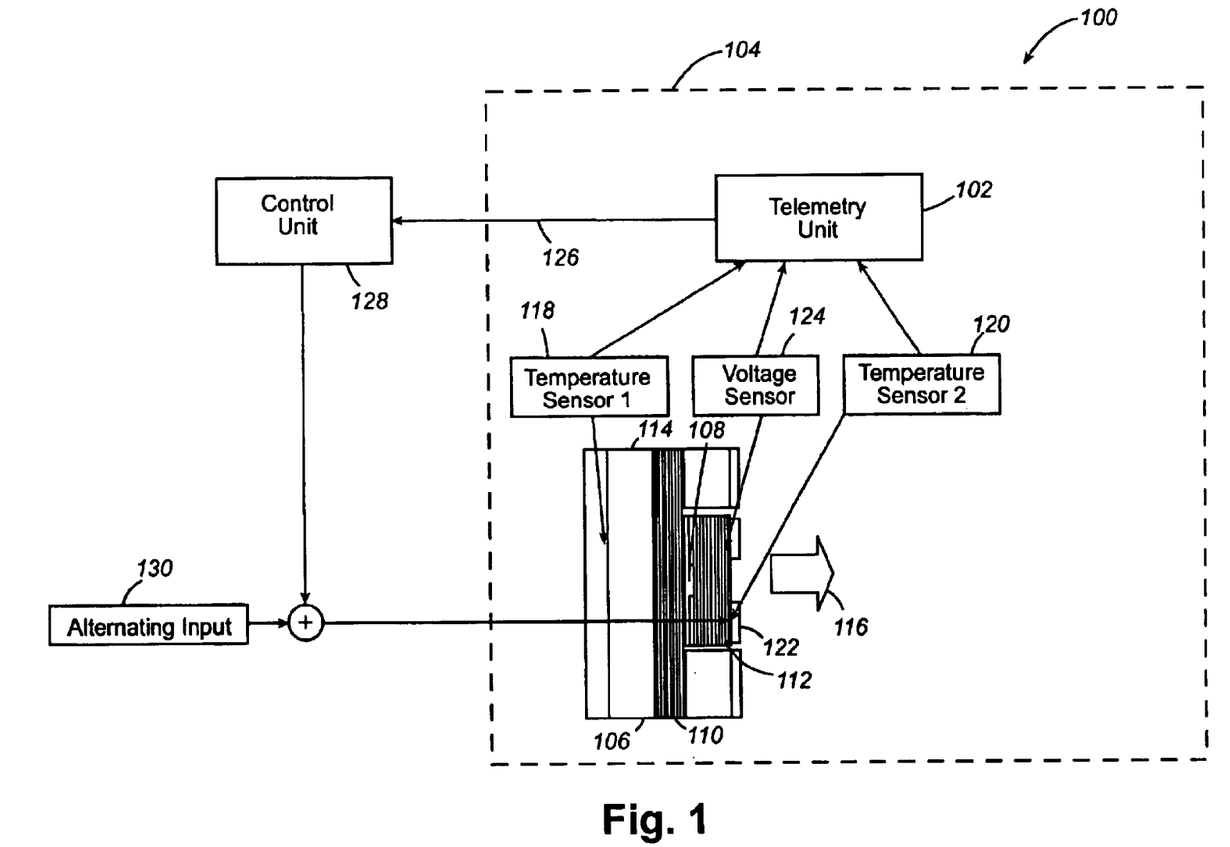
FIG. 1 schematically illustrates an embodiment of a laser device based on a VCSEL according to principles of the present invention FIG. 2 schematically illustrates a cross-section through an embodiment of a laser package according to principles of the present invention.

One embodiment of such a device 100 is schematically illustrated in FIG. 1, which shows a telemetry unit chip 102 contained within the laser package 104. In the illustrated embodiment, the laser 106 is a VCSEL device, formed by an active region 108 disposed between a high reflector 110 and an output coupler 112. The high reflector 110 and the output coupler 112 are typically distributed Bragg reflectors. The laser structure is fabricated on a substrate 114.

The optical output 116 from the laser 106 may be optically coupled within the package 104 to the outside. For example, the output 116 may pass to an optical fiber (not shown) or may be handled by a lens system. The output 116 may also propagate freely from the package 104.

The laser 106 may be provided with a number of different sensors. In the illustrated embodiment, the laser 106 is provided with a first temperature sensor 118 on the substrate 106, and a second temperature sensor 120 proximate the output surface 122 of the laser 106, for example, the output coupler 112. The laser 106 may also be provided with a voltage sensor 124 that measures the voltage drop across the active region 108. Other sensors, for example additional temperature sensors may also be provided within the package 104 and/or on the laser 106. For example, there may be a temperature sensor within the package 104 to measure the ambient package temperature, and temperature sensors may be fabricated by thin film deposition methods on the surface of the laser chip The sensors 118, 120 and 124 are coupled to the telemetry unit 102. The telemetry unit 102 may be provided in the form of an electrical circuit, such as an integrated circuit that is disposed within the package 104. The telemetry unit 102 receives the sensor signals from the various attached sensors 118, 120 and 124, and combines the sensor signals to produce a combined output signal. The combined output signal is transmitted on a data link 126 coupled to the laser control unit 128. The data link 126 may be a serial data link. The combined output signal may then be separated by the control unit into its component signals representing the sensor signals received by the telemetry unit 102. The telemetry unit 102 may be regarded as a multiplexing device to multiplex the sensor signals into a multiplexed output signal. The telemetry unit 102 typically digitizes the signals received from the attached sensors before transmitting the data to the control unit 128. The control unit 128 then demultiplexes the output signal to generate the component signals.

The control unit 128 controls the current fed to the laser 106. The laser 106 may be provided with a d.c. current and/or with an r.f. alternating current 130. The alternating current may be used to directly modulate the laser 106 so as to produce a modulated output.

The values of the voltage across the laser 106 and the current passing into the laser 106 (either measured or otherwise known to the control unit 128) permit the control unit 128 to calculate the electrical power flow, $P_{in}$, into the laser 10, through the relationship $P_{in}=V \times I$.

The useful light power output, $P_o$, from the laser may be calculated from consideration of the power flow within the laser 106. The output power may be calculated from the input power minus the thermal power losses of the laser 106, which may be written as:

$$P_o = P_{in} - P_{cond} - P_{conv} - P_{rad}$$

where $P_{cond}$ is the conductive heat loss, $P_{conv}$ is the convective heat loss, and $P_{rad}$ is the radiative heat loss.

With knowledge of the thermal impedance of the laser, θ, and the resulting temperature rise in the laser through one or more temperature measurements, the conductive heat loss may be calculated from $P_{cond} = (T_{las} - T_{hs})/\theta$, where $T_{las}$ is the laser temperature and $T_{hs}$ is the heatsink temperature.

The convective heat loss may be calculated as $P_{conv} = Ak(T_{las} - T_a)$, where A is the convective surface area, k is the convection heat transfer coefficient and $T_a$ is the ambient temperature.

The radiative heat loss may be calculated as $P_{rad} = A\sigma(T_{las}^4 - T_w^4)$ where σ is Stefan's constant and $T_w$ is the temperature of the interior wall of the laser package.

Once the fraction of internally dissipated power is known, the magnitude of the balance of the electrical input power that is emitted as light output may be calculated with good accuracy. It can be estimated that good optical power measurements can be obtained in this manner if relative temperatures are measured to within 0.01 Kelvin (K). For instance, it is often the case that conductive cooling is predominant relative to convective and radiative cooling. With a typical VCSEL thermal impedance of 1000 K/W (Kelvin per Watt), a temperature difference of 0.01 Kelvin corresponds to a change in power of 0.01 mW. In other words, if 0.01 mW of additional power is emitted as light rather than being dissipated internally, the temperature of the device decreases by 0.01K. This temperature precision is well within the limits of inexpensive thermistors and thermocouples, and the 0.01 mW resolution is sufficient for many laser control applications.

In addition, sophisticated electronic circuitry can be fabricated at very low cost due to the rapid advance of silicon integrated circuit technology. Complex circuits in silicon can, therefore, be fabricated for less than the cost of a monitoring photodetector. Thermocouples are also very inexpensive elements relative to optical detectors. In addition, the sensors and the telemetry unit 102 are integrable into a smaller total package because optical path length constraints demanded by getting light into the photodetector may be eliminated.

Also, a result of using the telemetry unit 102 may be that a single data lead, the serial data link 126, exits the laser package 104. The serial data link 126 may carry many combined electrical signals, so long as those electrical signals vary slowly enough that they do not require an aggregate bandwidth exceeding the bandwidth of a single electrical lead. For example, a bandwidth of 1 MHz may be sufficiently low to avoid interference with the in-band data transmission of a 1 Gb/sec data link. Such a bandwidth is sufficiently high to support, for example, the sampling and transmission off-chip of 10 channels of information at roughly 5,000 samples per second per channel for 16 bit data resolution per channel. It will be appreciated that other types of electrical leads may also be used with the laser package 104. For example, other leads may include a DC power supply lead for the telemetry unit 102, a current supply lead for the laser 106, a current control lead for an active cooling unit and a ground lead. One or more of these leads may be combined. For example, the serial data lead may be sent on the same lead as the DC power supply lead for the telemetry unit 102, with the AC telemetry signals being separated from the DC bias voltage.

The laser package typically is a sealed unit in which the laser is placed for protection from the environment. The laser is typically delivered from the manufacturer in the package, which has all the necessary electrical leads to make contact with the various electrical devices inside the package. Therefore, once the laser has been integrated into a system, the laser package provides the controlled environment in which the laser operates. The laser package may contain a temperature control device, such as a thermoelectric cooler, and optionally also contains optical systems for extracting the light from the package to the outside. The package also contains the various sensors and the telemetry unit.

Figure 2:
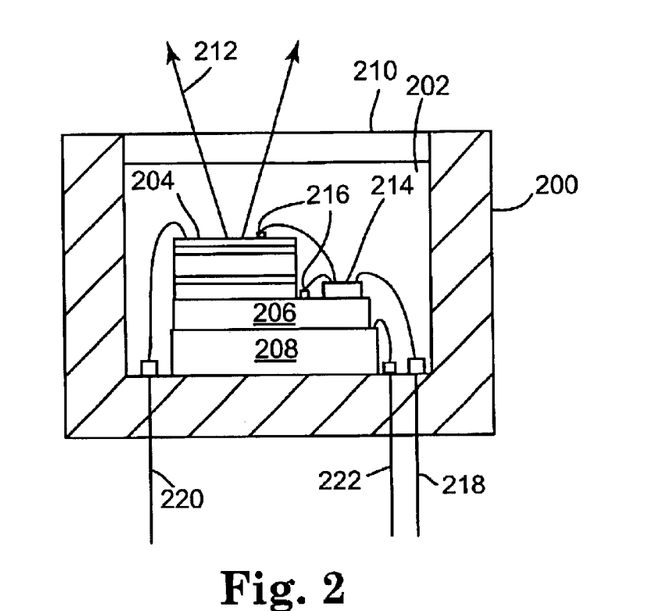

One example of a laser package, suitable for use with a VCSEL, is schematically illustrated in FIG. 2. The package housing 200 defines a chamber 202 in which the laser 204 is positioned. The laser 204 is typically mounted on a sub-mount 206, which may be thermally conductive but electrically isolating, and may be formed from a ceramic, such as alumina or beryllia, or silicon nitride. The submount 206 may be mounted on top of a cooling unit 208, such as a thermoelectric cooler. In the illustrated embodiment, the package 200 includes a window 210, through which the light 212 from the laser 204 is transmitted. It will be appreciated that other optical components may be used to extract the light from the package housing 200, including optical fibers, lenses, and the like.

The telemetry unit 214 is also contained within the package. In the illustrated embodiment, the telemetry unit 214 is mounted on the submount 206, although it may be mounted elsewhere within the package 200. The telemetry unit 214 is coupled to various sensors 216 within the package housing 200 The signals from the telemetry unit 214 are extracted out of the package through the data link 218, in this case a lead suitable for serial data transmission. Other leads coupling to devices within the package housing 200 are also illustrated. A power lead 220 is coupled to provide current to the laser 204, and a cooling control lead 222 provides power to the cooling unit 208. The ground return lead is not illustrated. Other electrical connections may also be present.

The use of telemetry within the laser package may be broadly applied, and yields significant benefits when applied to sophisticated laser types including, but not limited to, DFB lasers, tunable DFB lasers, tunable VCSELs or external cavity lasers. An example of an external cavity stabilized VCSEL is now described. A scheme for executing integrated telemetry in an external cavity VCSEL device 300 is schematically presented in FIG. 3.

Figure 3:
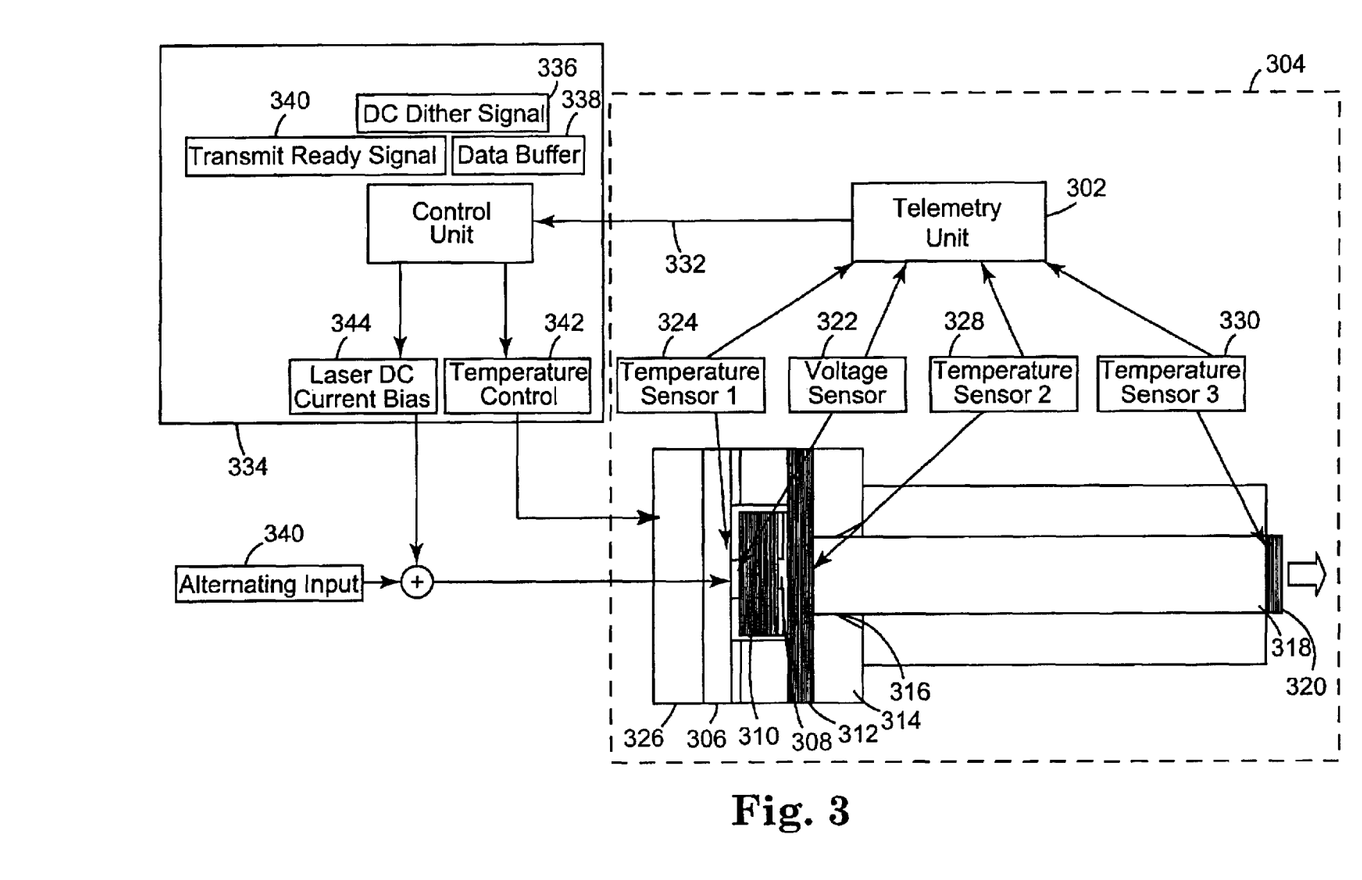
FIG. 3 schematically illustrates an embodiment of a laser device based on an external cavity VCSEL according to principles of the present invention.

The device 300 includes a telemetry unit 302 located within the laser package 304. The VCSEL laser 306 is formed by an active region 308 disposed between a high reflector 310 and an intracavity reflector 312. In this particular embodiment, the intracavity reflector 312 is disposed on the substrate 314. An aperture 316 in the substrate 314 permits light from the output coupler 312 to pass along an external cavity member 318 to an output coupler 320.

The external cavity member 318 is substantially transparent to the light produced by the laser 306, and may be an empty tube, a length of optical fiber or the like. In one particular approach, the external cavity member is a length of gradient index fiber which is cut to a selected length. The gradient index fiber acts as a gradient index lens (GRIN), and the selected length may be an integral number of pitches of the GRIN lens. This approach is described further in U.S. patent application Ser. No. 10/411,637, entitled "FIBER EXTENDED, SEMICONDUCTOR LASER", filed on same date date as this application by Robert L. Thornton and is incorporated herein by its reference. It will be appreciated that the specific values of the reflectivities of the intracavity reflector 312 and the output coupler 320 may affect the mode frequencies on which the laser 306 oscillates.

The laser 306 may be provided with several sensors, four of which are illustrated. A voltage sensor 322 is disposed on the laser to measure the voltage drop across the laser 306. A first temperature sensor 324 may be disposed proximate the high reflector 310 to measure the temperature of the high reflector end of the laser. A cooling device 326, such as a thermoelectric cooler, may be attached to the laser 306. In the illustrated embodiment, the cooling device 326 is attached to the laser 306 at the high reflector end, close to the first temperature sensor 324. The cooling device 326 may be provide with one or more temperature sensors (not shown). A second temperature sensor 328 may be disposed proximate the intracavity reflector 312, and a third temperature sensor 330 disposed proximate the output coupler 320.

The sensors 322, 324, 328 and 330 are coupled to the telemetry unit 302, which sends a data signal along a data link 332 to the laser's control unit 334. The data link 332 may be a serial data link. In this embodiment, the control unit 334 controls current applied to the laser 306 and also controls the cooling unit 326. Thus, the control unit 334 may be used to control the power output from the laser 306 and also control the operating temperature of the laser via a temperature control signal 342. The control unit 334 may include various sub-units, for example a d.c. dither signal generator 336 that applies a dither to the d.c. current signal applied to the laser 306. The control unit 334 may also include a data buffer 338 for storing data received from the telemetry unit 302, and may include a transmit ready signal unit, to indicate that the device has achieved specific operating conditions suitable for a specific operation.

The laser 306 is driven by a d.c. bias current 344 from the control unit 334. The bias current may be dithered by the dither signal generator 336. The laser 306 may also be directly modulated through the application of a high frequency alternating signal 340 added to the bias current.

The voltage sensor 322 and the three temperature sensors 324, 328 and 330 may be used to stabilize the wavelength and output power of the laser, by controlling the laser current and the thermoelectric cooler current. The second and third temperature sensors 328 and 330 may be used to establish the average temperature of the external cavity member 318. Maintaining this average temperature constant, to a high degree of accuracy, maintains a fixed value for the emission wavelength of the device, and also corrects for any heating of the external cavity from the laser chip itself.

Figure 4:
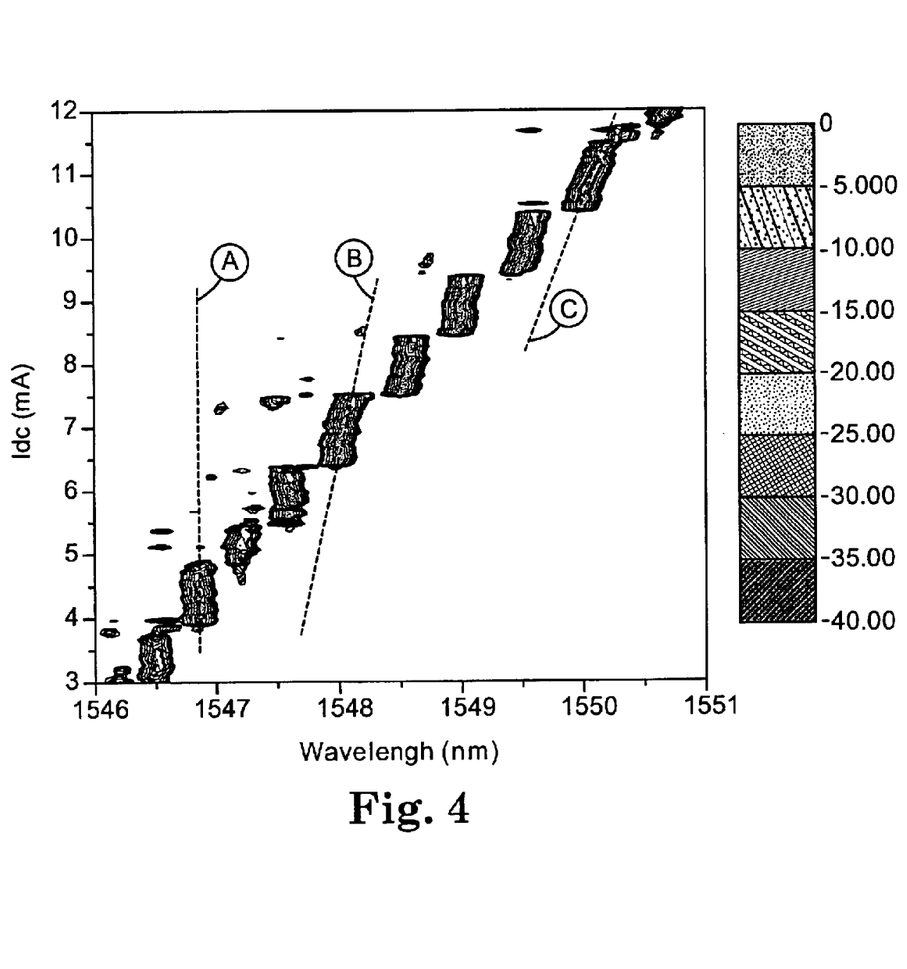
FIG. 4 graphically presents experimental data showing a relationship between operating wavelength and current for an external cavity VCSEL.

Experimentally obtained data illustrating the relationship between the operating wavelength of an unstabilized external cavity VCSEL and the laser current are presented in FIG. 4. One important feature to note from the data is that there are discrete jumps in wavelength as the current is increased or decreased. These wavelength jumps correspond to heating of the VCSEL chip, causing it to jump from one longitudinal mode of the external cavity to the next.

Another feature of the data is that, within a single cavity mode, the slope of the wavelength change with current depends on the value of the current. For example, slope A, obtained at relatively low bias current, is very high, showing that the cavity length changes little with increased current. Slope C, obtained at relatively high current shows an increased wavelength sensitivity to the current. Slope B, obtained at an intermediate level of current, shows an intermediate wavelength sensitivity to the current. This increase in the wavelength sensitivity with higher values of current is due to the heating of the external cavity by the VCSEL. The characteristic of the behavior, that of increased sensitivity at higher current levels is believed to arise from heating due to resistive ohmic losses in the VCSEL device.

The external cavity length may be stabilized to reduce the wavelength sensitivity on the value of the operating current. This may be achieved by using signals from the second and third temperature sensors 328 and 330 to derive a control signal in the temperature control loop 342. The temperature control loop 342 controls the operating temperature of the cooling unit 326 to compensate for the heating of the external cavity by the VCSEL. This maintains the external cavity at a constant average temperature, thereby maintaining the wavelength to be constant.

The wavelength mode hops illustrated in FIG. 4 result in undesirable operation from the laser. It is important to note, however, that in the regions between the mode hops, the optical and electrical performance of the laser is very good: single longitudinal mode operation is available with high side mode suppression and high data modulation rate. It is therefore an important function of the control unit 334 to ensure that the bias current applied to the laser 306 is centered between the current values associated with mode hops, so that the laser's operation is based on a stable, single mode with high side mode suppression. For this purpose, measurement of the VCSEL voltage provides functionality beyond the previously mentioned derivation of the device output power, as is now described.

Figure 5:
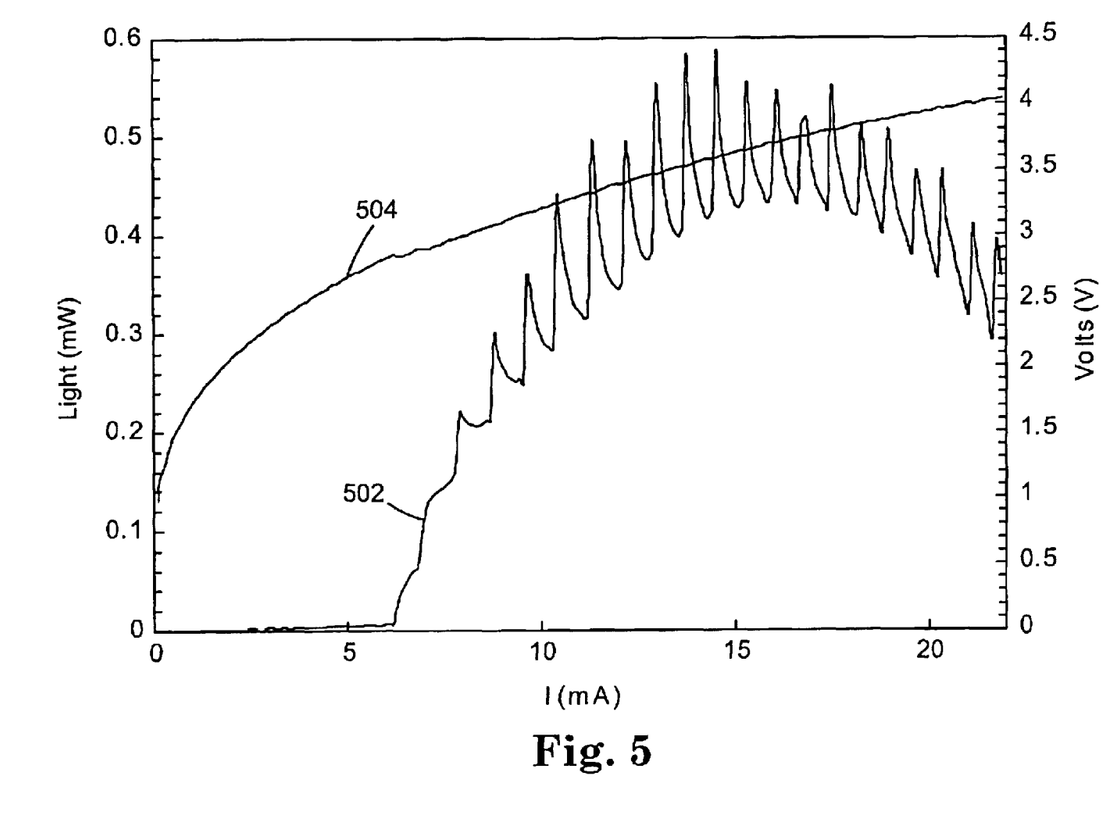
FIG. 5 graphically presents experimental data showing the dependence of laser output power and laser operating voltage as a function of current for an external cavity VCSEL.

FIG. 5 shows two operational characteristics for a typical external cavity VCSEL. One, illustrated as curve 502, shows the relationship between light output from the laser as a function of the laser current. The oscillatory behavior of the light output power as a function of changing laser current is generally observed, and is directly related to the longitudinal mode hops illustrated in FIG. 4. The other characteristic, illustrated as curve 504, is the voltage across the laser as a function of laser current.

Detecting the positions of the peaks and valleys of the oscillations, and therefore the positions of the mode hops, is important to determining the appropriate values of the device's operating current. This information would conventionally be obtained using a photodetector and, in some situations, a beamsplitter. However, appropriate data extraction from the measurement of the device voltage can yield similar, and arguably superior, information.

Figure 6:
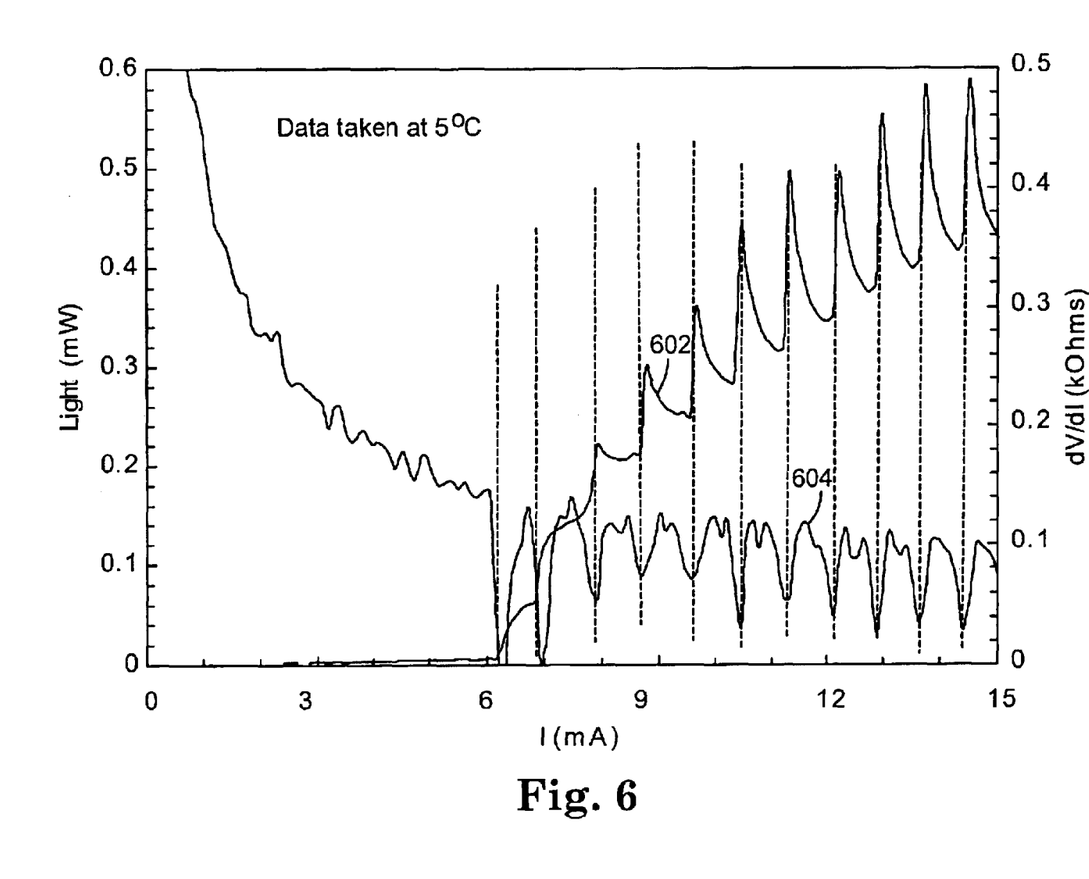
FIG. 6 graphically presents experimental data showing the laser output power and the first derivative of laser operating voltage as a function of current for an external cavity VCSEL.

One illustration of the use of voltage information is now described with reference to FIG. 6, which shows a plot of light output from the laser as a function of laser current, curve 602. The second plot, curve 604, shows the first derivative of the voltage across the laser with respect to laser current. As can be seen from the dashed vertical bars, there is a direct correlation between positions of the mode hops and the prominent local minima of the voltage derivative. Correspondingly, there is a direct correlation between the prominent local maxima of the voltage derivative and the positions between the mode hops, which are the desired operating points. Consequently, it is possible to build a control loop which stabilizes on one of the multiple high performance operating points based on data extraction from the first derivative of the voltage. Which particular operating point is selected out of the plurality of operating points is determined by the desired total output power operating point for the device, which, as has been previously discussed, can be derived from the combination of voltage and temperature measurements.

Figure 7:
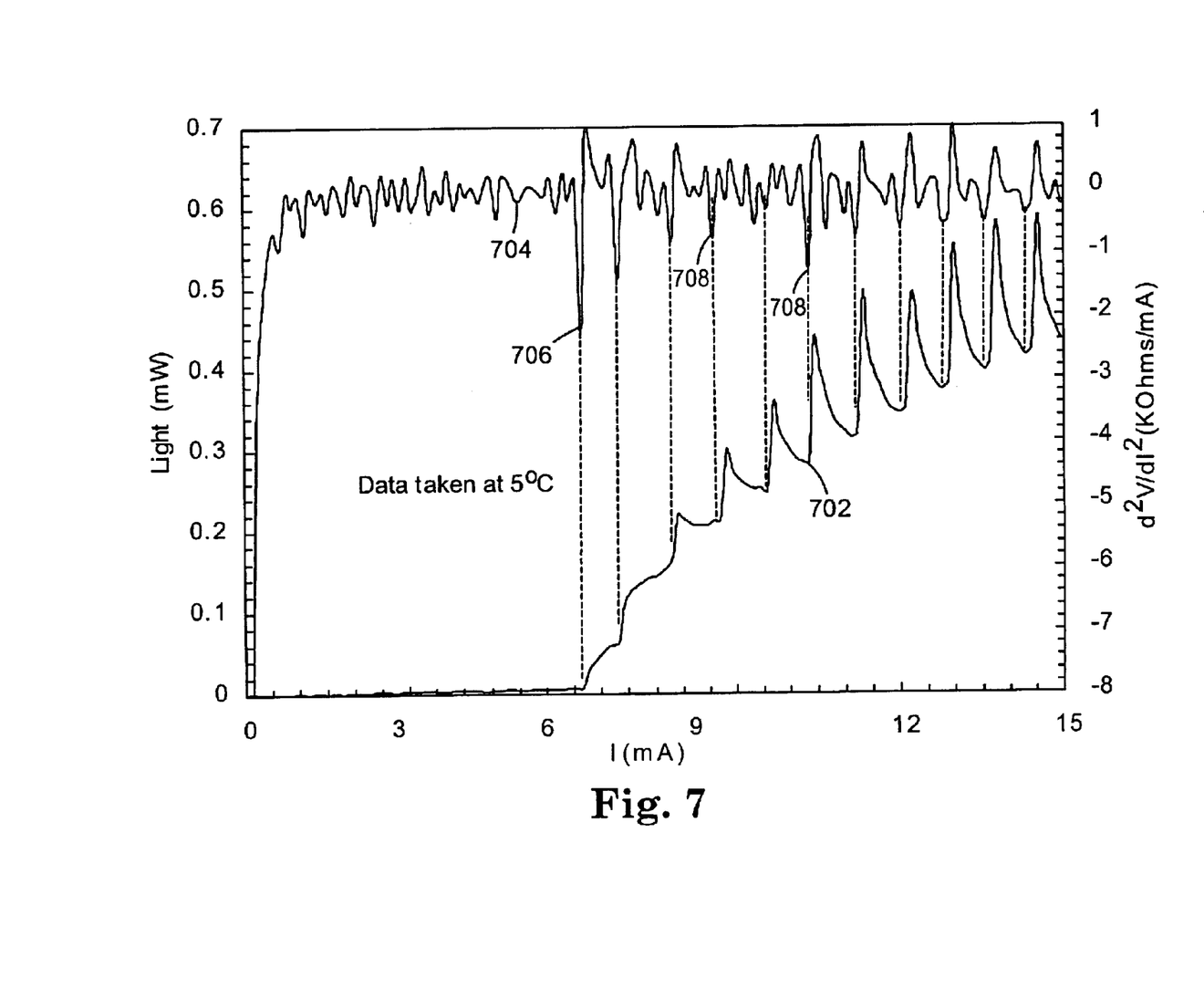
FIG. 7 graphically presents experimental data showing the laser output power and the second derivative of laser operating voltage as a function of current for an external cavity VCSEL.

More detailed analysis of the voltage signal may provide additional information of potential utility in subsystem control. An example is now described with reference to FIG. 7, which shows a plot of light output from the laser as a function of laser current, curve 702. Also shown is a plot, curve 704, showing the second derivative of the voltage across the laser with respect to laser current. Despite the fact that increasing differentiation produces an increasing level of noise on this signal, there is a clear signature of the threshold current for the laser, labeled 706, as well as signatures for each of the longitudinal mode hops, labeled 708. With the addition of noise reduction, the mode-hop signatures may be used to increase the efficiency of the control algorithm used to stabilize on the appropriate longitudinal mode center.

It is important to note that there is the option of including a photodetector, with or without a beamsplitter, within the laser package. The photodetector signal may be used as one of the telemetry signals, if desired, for reasons of redundancy, precision or other reasons. The addition of a photodetector may be appropriate in design situations where cost, size or available power are less constraining.

Figure 8:
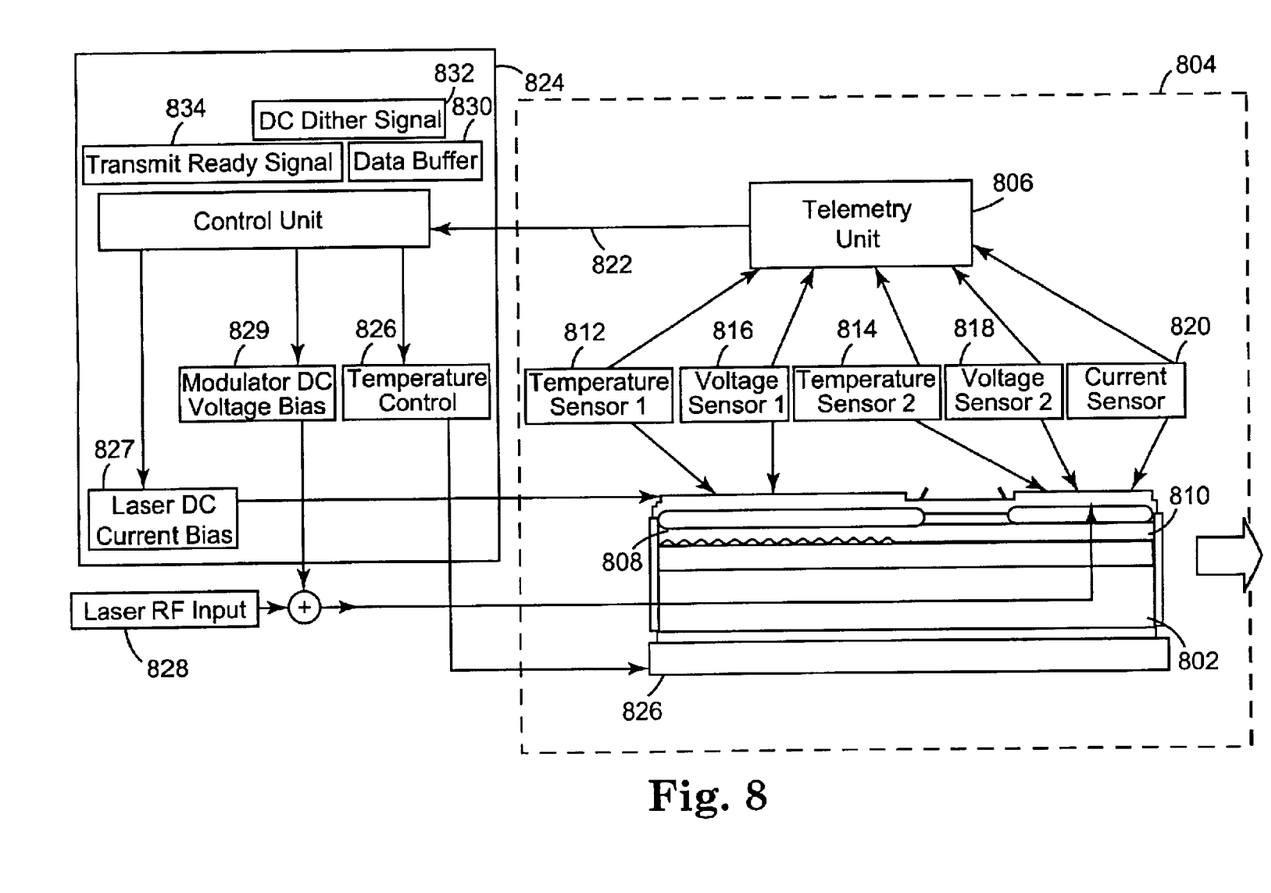
FIG. 8 schematically illustrates an embodiment of a laser device based on a distributed feedback laser according to principles of the present invention.

Another embodiment of the invention is schematically illustrated in FIG. 8, in which an edge-emitting-type laser unit 802 is disposed within a package 804 containing a telemetry unit 806. An edge-emitting laser is one where the light propagates within the active region in a direction substantially parallel to the layers forming the laser. The laser light typically exits the laser at its edge, hence the term "edge-emitting". However, the laser may be integrated with other devices, for example a waveguide, a modulator, or the like, in which case the light may be emitted from the integrated element rather than the laser's edge. Such integrated laser devices are also considered to be edge-emitter lasers. Edge emitting lasers include, inter alia, distributed Bragg reflector (DBR) lasers, distributed feedback (DFB) lasers, tunable semiconductor lasers, in addition to other types of lasers.

In the illustrated embodiment, the laser unit 802 is a DFB laser 808 integrated with a modulator 810 for externally modulating the light output from the laser 808. The laser unit 802 may be provided with a number of sensors. For example, first and second temperature sensors 812 and 814 may be positioned on the DFB laser 808 and the modulator 810 respectively. Furthermore, the DFB laser 808 and the modulator 810 may each be provided with respective voltage sensors 816 and 818. The laser 808 and the modulator 810 may each be provided with respective current sensors: only a modulator current sensor 820 is shown. The modulator 810 may be integrated with the laser 808, as illustrated, or may be separate from the laser 808. The modulator 810 may be any suitable type of optical modulator. When the modulator 810 is integrated with the laser 808, the modulator 810 may be an electroabsorption modulator.

The sensors 812–820 are coupled to the telemetry unit 806 which transfers sensor data out of the package 804 on a data link 822, which may be a serial data link, to the control unit 824. The control unit 824 controls the operating temperature of the laser unit 802 through the control of a cooling unit 826, which may be a thermoelectric cooler. The control unit 824 also controls the d.c. bias 827 current directed to the DFB laser 808 and may provide a d.c. bias voltage 829 for the modulator 810. The modulator bias voltage may be added to an alternating signal 828 that controls the modulation of the light output from the DFB laser 808.

The control unit 824 may include a data buffer 830 to store data received from the telemetry unit 806, and a d.c. dither signal generator 832 for dithering the d.c. current applied to the DFB laser 808. The control unit 824 may also include a transmit ready signal unit 834 that produces a signal indicating that the laser system has reached an equilibrium state and is ready for stable operation.

Figure 9:
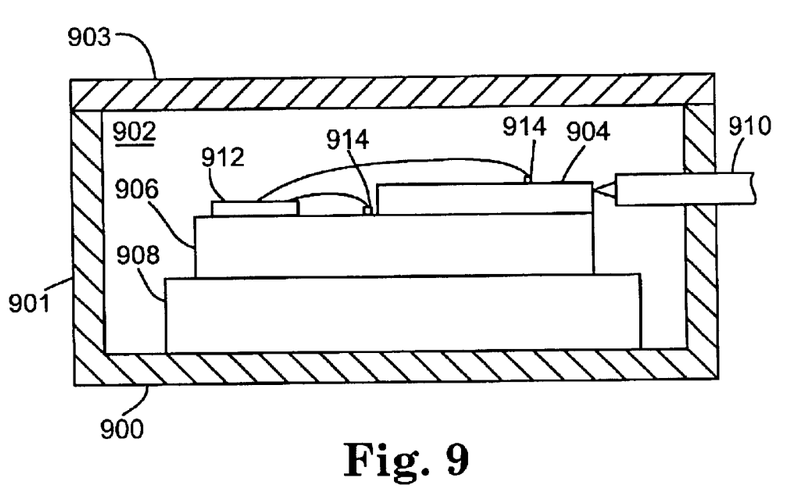
FIG. 9 schematically illustrates a cross-section through an embodiment of a laser package according to principles of the present invention.

One particular embodiment of a package for an edge-emitting-type laser is schematically illustrated in FIG. 9. The package housing 900 defines a chamber 902 in which the laser unit 904 is positioned, and is typically formed by a base 901 having walls and a floor, and a lid 903. The laser unit 904 is typically mounted on a sub-mount 906, which may be thermally conductive but electrically isolating, and may be formed from a ceramic, such as alumina or beryllia, or silicon nitride. The submount 906 is mounted on top of a cooling unit 908, such as a thermoelectric cooler. In the illustrated embodiment, the package housing 900 includes a fiber 910 which collects the light emitted from the edge of the laser unit 904 and transmits the light outside the package 900. It will be appreciated that other optical components may be used for extracting light from the package housing 900.

The telemetry unit 912 is also contained within the package housing 900. In the illustrated embodiment, the telemetry unit 912 is mounted on the submount 906, although it may be mounted elsewhere within the package housing 900. The telemetry unit 912 is coupled to various sensors 914 within the package housing 900. Two sensors 914 are illustrated, but it will be appreciated that several more may be used. The signals from the telemetry unit 914 are extracted out of the package through a data link.

The leads directing electrical signals into and out of the package housing 900 are often positioned to the side of the package 900 and extend sideways from the package housing 900: such a package is commonly referred to as a "butterfly package." These leads are not illustrated in the drawing. Further, the addition of chip telemetry may facilitate reducing the package size for an edge emitter to a size substantially smaller than the conventional butterfly package.

Figure 10:
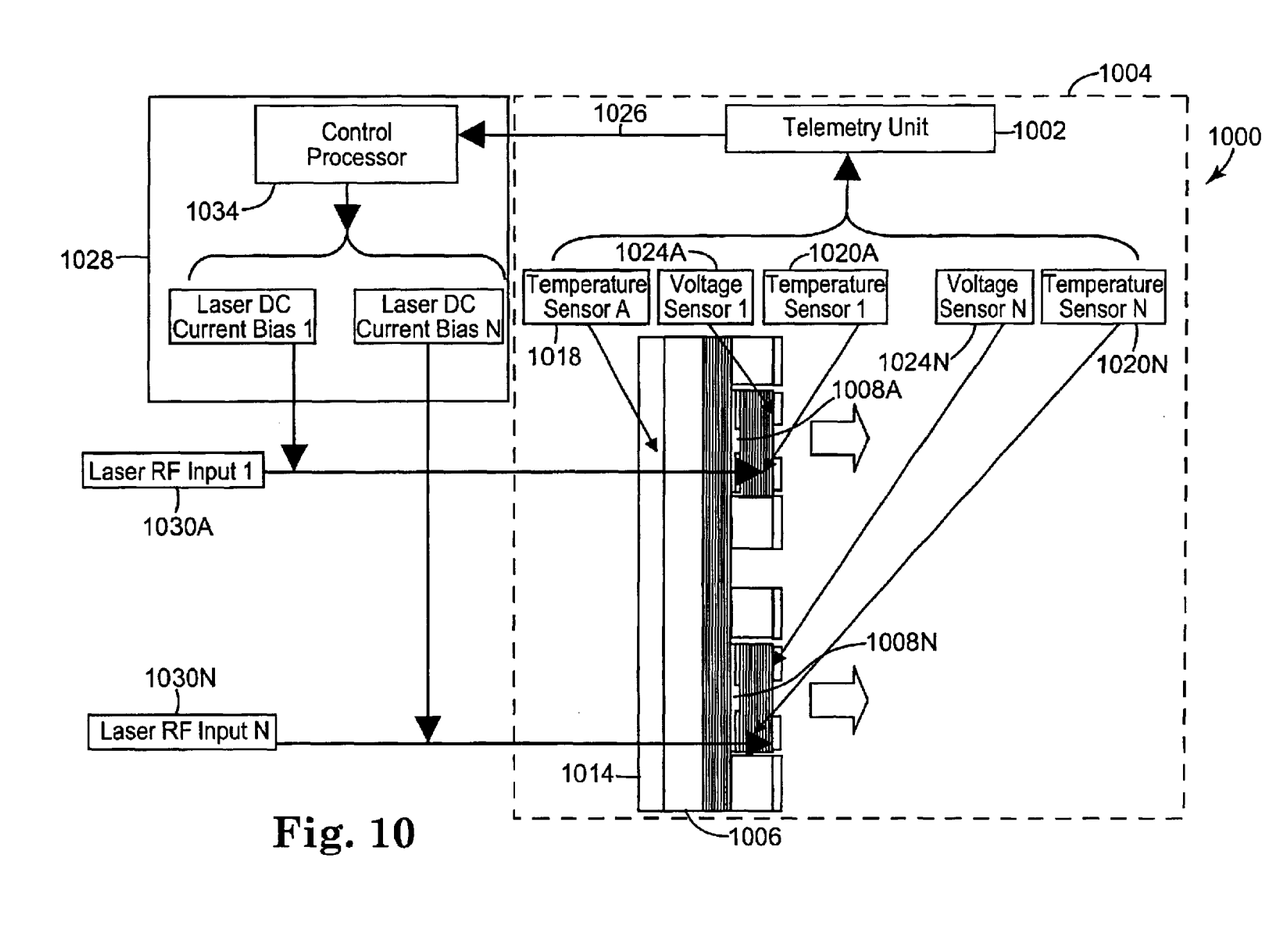
FIG. 10 schematically illustrates an embodiment of an array laser device according to principles of the present invention.

The use of a telemetry unit within a laser package need not be restricted to packages for single laser devices, and may also be used for controlling/sensing multiple lasers in a package. One embodiment of multiple laser sensing is schematically illustrated in FIG. 10, which shows a laser system 1000 that uses a telemetry unit 1002 within a laser package 1004. The laser unit 1006 is a laser array, having at least two laser emitters 1008A–1008N, each of which may be independently controlled. In this description, the number of emitters 1008 is given as N, where N is an integer number equal to 2 or more. In the illustrated embodiment, the laser emitters 1008A–1008N are VCSEL-type laser emitters, although other types of laser emitter may also be used.

The telemetry unit 1002 may be coupled to receive information from a number of sensors related to the different laser emitters 1008A–1008N. For example, the telemetry unit 1002 may be coupled to receive voltage information for each laser emitter 1008 from respective voltage sensors 1024A–1024N. The telemetry unit 1002 may also be coupled to receive information from respective temperature sensors 1020A–1020N. Other sensors may also be used to measure various parameters associated with the individual emitters 1008A–1008N, for example current sensors detecting the current applied to each laser emitter 1008A–1008N, or the like.

The telemetry unit 1002 may also be coupled to receive information from one or more sensors that are not related to the different laser emitters 1008A–1008N. For example, the telemetry unit 1002 may be coupled to a substrate temperature sensor 1018 that detects the temperature of the substrate 1014 on which the laser emitters 1008A–1008N are fabricated. Other sensors that are not associated with particular laser emitters 1008A–1008N may also be used, such as a temperature sensor to detect the operating temperature of a heatsink or active cooling device.

The data from the telemetry unit 1002 are directed out of the laser package 1004 along the data link 1026, which may be a serial data link, to the control unit 1028. The control unit 1028 may include a control processor 1034 that receives the information relayed from the telemetry unit 1002, and analyzes the information to determine the state of operation of each laser emitter 1008A–1008N. The control unit 1028 may also include DC current supplies 1032A–1032N associated with respective laser emitters 1008A–1008N, which are controlled by the control processor 1034. RF or AC signals may be applied to the laser emitters 1008A–1008N from respective AC sources 1030A–1030N. The emitters 1008A–1008N may thus be controlled and modulated independently of each other. It will be appreciated that one or more active cooling units, such as thermoelectric coolers, may be used within the package 1004 for controlling temperature of the laser emitters 1008A–1008N.

A new platform for semiconductor laser control has been described. It provides the option of eliminating the optical photodetector in the control system for the laser, although in some systems the output of such a photodetector may be simply another one of the telemetry signals sent back to the controller. The new platform further provides for lower cost modules and smaller package sizes, resulting from the fundamental improvement of placing a telemetry chip, along with the appropriate set of sensors, inside the laser package.

Independently of whether or not the telemetry is performed within the laser package, a method for controlling of both stand-alone and multiple cavity laser devices has been described that is based on processing of current, voltage and distributed temperature information. In addition, an algorithm specifically for controlling an external cavity laser in order to stabilize its wavelength single frequency spectrum and output power has been described. The algorithm is based on independently sensing the temperature of the external cavity and the laser, along with the voltage across the laser voltage, and possibly the laser power, and independently controlling the external cavity temperature and the laser current.

As noted above, the present invention is applicable to semiconductor laser and is believed to be particularly useful for operating semiconductor lasers that are contained within a package. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

I claim:

1. A laser device, comprising:
   a laser package housing;
   at least one semiconductor laser unit disposed within the package housing;
   at least one sensor disposed within the package housing for sensing an operational characteristic of the at least one semiconductor laser unit and generate a signal representative of an instantaneous value of the operational characteristic; and
   a telemetry unit disposed within the laser package housing, the at least one sensor being coupled to the laser telemetry unit, the telemetry unit being coupled to a data link that passes out of the laser package housing.

2. A device as recited in claim 1, wherein the laser unit comprises a vertical cavity, surface emitting laser (VCSEL).

3. A device as recited in claim 2, wherein the at least one sensor comprises at least first and second temperature sensors disposed to measure temperature at different locations of the VCSEL.

4. A device as recited in claim 2, wherein the at least one sensor comprises a voltage sensor disposed to determine an operating voltage across the VCSEL.

5. A device as recited in claim 2, wherein the VCSEL is an external cavity VCSEL comprising a high reflector, an output coupler and an intracavity reflector between the high reflector and the output coupler, an active region being disposed between the high reflector and the intracavity reflector.

6. A device as recited in claim 5, wherein the at least one sensor comprises first, second and third sensors disposed proximate the high reflector, the intracavity reflector and the output coupler respectively.

7. A device as recited in claim 1, wherein the laser unit comprises an edge-emitting-type laser unit.

8. A device as recited in claim 7, wherein the at least one sensor comprises a first temperature sensor disposed to sense a temperature of the laser unit and a first voltage sensor disposed to sense an operating voltage of the laser unit.

9. A device as recited in claim 8, further comprising a modulator disposed to modulate light emitted from the laser unit.

10. A device as recited in claim 9, further comprising a second temperature sensor disposed to sense a temperature of the modulator and a second voltage sensor disposed to sense an operating voltage across the modulator.

11. A device as recited in claim 10, further comprising a current sensor disposed to sense a current passing through the modulator.

12. A device as recited in claim 9, wherein the modulator is an electroabsorption modulator integrated in the edge-emitting type laser unit.

13. A device as recited in claim 1, wherein the at least one sensor comprises a thin film temperature sensor deposited on a laser chip of the at least one semiconductor laser unit.

14. A device as recited in claim 1, further comprising a control unit coupled to receive sensor data from the laser telemetry unit and to provide a bias current to the semiconductor laser unit.

15. A device as recited in claim 14, further comprising a cooling unit disposed within the package housing to control an operating temperature of the laser unit, wherein the control unit is coupled to control the cooling unit.

16. A device as recited in claim 14, wherein the control unit includes a data buffer to receive information from the laser telemetry unit.

17. A device as recited in claim 14, wherein the control unit includes a dither unit to dither the bias current provided to the laser unit.

18. A device as recited in claim 14, wherein the control unit receives information from at least one temperature sensor disposed within the package housing and adjusts an operating temperature of the laser unit to a desired value so as to operate the laser unit on a single mode at a frequency associated with relatively high side mode suppression.

19. A device as recited in claim 14, wherein the control circuit selects a value of the bias current provided to the laser unit, at least in part based on a first derivative of an operating voltage of the laser unit with respect to bias current.

20. A device as recited in claim 14, wherein the control circuit selects a value of the bias current provided to the laser unit, at least in part based on a second derivative of an operating voltage of the laser unit with respect to bias current.

21. A device as recited in claim 14, wherein the control circuit calculates a value of light output from the laser based on determined values of at least one temperature of the laser unit, bias current through the laser unit and operating voltage of the laser unit.

22. A device as recited in claim 1, wherein the data link is a serial data link.

23. A device as recited in claim 1, wherein the at least one semiconductor laser unit comprises a semiconductor laser array having at least two laser emitters.

24. A device as recited in claim 23, wherein the at least one telemetry unit is coupled to at least two temperature sensors respectively associated with the at least two laser emitters.

25. A device as recited in claim 23, wherein the at least one telemetry unit is coupled to at least two voltage sensors respectively associated with the at least two laser emitters.

26. A device as recited in claim 23, wherein the at least one telemetry unit is coupled to at least one sensor within the laser package housing that is not associated with a particular one of the at least two laser emitters.

27. A device as recited in claim 26, wherein the at least one sensor not associated with a particular one of the at least two laser emitters is a temperature sensor.

28. A device as recited in claim 23, further comprising a control unit, the control unit being coupled to receive data from the at least one telemetry unit and comprising at least two current supplies coupled to respective at least two laser emitters.

29. A device as recited in claim 23, further comprising at least two AC current sources coupled respectively to the at least two laser emitters.

30. A device as recited in claim 1 wherein said laser telemetry unit receives the signal from the at least one sensor, said laser telemetry unit provides the received signal onto the data link to the exterior of the laser package housing.

31. A device as recited in claim 1, wherein the laser unit operational characteristic is temperature, voltage or bias current.

32. A device as recited in claim 31, wherein the at least one sensor is a temperature sensor or a voltage sensor.

33. A device as recited in claim 1 further comprising a plurality of sensors in the package for sensing a plurality of operational characteristics of the at least one semiconductor laser unit and generate a plurality of signals each representative of an instantaneous value of one of the operational characteristics.

34. A device as recited in claim 33, wherein the laser unit operational characteristics are one or more temperatures, one or more voltages or bias currents.

35. A device as recited in claim 33, wherein the sensors are temperature sensors or voltage sensors or both.

36. A device as recited in claim 33, wherein the sensors measure one or more temperatures or voltage drops of the at least one semiconductor laser unit.

37. A device as recited in claim 33, the telemetry unit receives the signals and produces a combined signal output for transmission on the data link to the exterior of the laser package housing.

38. A device as recited in claim 37, wherein the data link is a serial data link.

39. A method for controlling a laser, comprising:
sensing at least one operational characteristic of a laser within a laser package housing to produce at least one sensor signal;
producing, within the laser package housing, a telemetered output signal in response to the at least one sensor signal; and
directing the telemetered signal out of the laser package housing.

40. A method as recited in claim 39, further comprising sensing at least two operational characteristics within the laser package to produce at least two sensor signals, and wherein producing the telemetered output signal comprises combining the at least two sensor signals to produce the telemetered output signal.

41. A method as recited in claim 39, further comprising separating the telemetered signal within a control unit to produce separated sensor signals.

42. A method as recited in claim 41, further comprising controlling an operational characteristic of the laser in response to the separated sensor signals.

43. A method as recited in claim 42, wherein the operational characteristic of the laser is bias current.

44. A method as recited in claim 42, wherein the operational characteristic of the laser is temperature.

45. A method as recited in claim 39, further comprising determining an operating point of the laser corresponding to single mode operation with relatively high side mode suppression and operating the laser at that operating point.

46. A method as recited in claim 45, wherein determining the operating point of the laser includes determining a first derivative of voltage across the laser with respect to bias current, and selecting as the operating point a value of bias current corresponding to a turning point in the first derivative of the voltage.

47. A method as recited in claim 45, wherein determining the operating point of the laser includes determining a second derivative of voltage across the laser with respect to bias current, and selecting as the operating point a value of bias current corresponding to a turning point in the second derivative of the voltage.

48. A method as recited in claim 39, further comprising determining a value of output power of the laser from the telemetered signal.

49. A method as recited in claim 48, further comprising determining the value of the output power of the laser without detecting light output from the laser.

50. A method as recited in claim 49, wherein determining the value of the output power of the laser comprises determining the output power from the laser based on the voltage across the laser, the current through the laser and the temperature of the laser.

51. A method as recited in claim 39, wherein directing the telemetered signal out of the laser package comprises transmitting the telemetered signal over a serial data link.

52. A method for controlling a vertical cavity, surface emitting laser (VCSEL), comprising: determining a value of operating voltage across the VCSEL and bias current through the VCSEL; determining a single mode operating point of the VCSEL from a derivative of the operating voltage with respect to bias current; and setting the bias current to a value associated with the single mode operating point.

53. A method as recited in claim 52, wherein the derivative comprises at least the first derivative.

54. A method as recited in claim 52, wherein the derivative comprises at least the second derivative.

55. A method as recited in claim 52, further comprising determining a temperature of the VCSEL, and determining a value of light output power from the VCSEL based on the operating voltage, the bias current and the temperature.

56. A method as recited in claim 52, wherein the VCSEL is an external cavity VCSEL having a cavity formed by a high reflector, an output coupler and an intracavity reflector between the output coupler and the high reflector, determining an average temperature of the cavity and maintaining the average temperature of the cavity to be constant so as to stabilize an output frequency of the laser.

57. A method as recited in claim 56, wherein determining an average temperature of the cavity includes determining a first temperature proximate the internal reflector and a second temperature proximate the output coupler and taking an average of the first and second temperatures.

58. A method for controlling a vertical cavity, surface emitting laser (VCSEL), comprising the steps of:

coupling an external cavity to the VCSEL to form a compound cavity that includes a cavity of the VCSEL;

determining a temperature of the external cavity of the VCSEL;

controlling independently the temperature of the external cavity of the VCSEL to a target value and a bias current to the VCSEL so as to stably maintain laser oscillation in the compound cavity on a single longitudinal mode.

59. A method as recited in claim 58, wherein determining the temperature of the external cavity of the VCSEL comprises measuring a first temperature proximate to an outer end of the VCSEL cavity;

measuring a second temperature proximate to an the output end of the external cavity; and obtaining an average of the first and second temperatures, the average being assigned as the temperature of the external cavity.

60. A method as recited in claim 58, further comprising determining a value of an operating voltage of the VCSEL and bias current through the VCSEL and determining a single mode operating point of the VCSEL from a derivative of the operating voltage with respect to bias current, and setting the bias current to a value associated with the single mode operating point.

61. A method as recited in claim 60, wherein the derivative comprises at least the first derivative.

62. A method as recited in claim 60, wherein the derivative comprises at least the second derivative.

63. A method as recited in claim 58, further comprising measuring a determining a value of light output from the VCSEL based on the operating voltage, the bias current and the temperature of the VCSEL cavity.

64. A method as recited in claim 58, wherein the compound cavity is formed by a first reflector and an intercavity reflector of the VCSEL and an output coupler of the external cavity.

65. A method as recited in claim 58, wherein the step of independently controlling the temperature of the external cavity includes the step of controlling the temperature of the VCSEL to control the temperature of the external cavity.

* * * * *